(12) United States Patent
Jung et al.

(10) Patent No.: US 10,510,293 B2
(45) Date of Patent: Dec. 17, 2019

(54) ORGANIC LIGHT-EMITTING DISPLAY DEVICE AND DRIVING METHOD THEREOF

(71) Applicant: LG Display Co., Ltd., Seoul (KR)

(72) Inventors: DaeSung Jung, Paju-si (KR); SangMoo Song, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 83 days.

(21) Appl. No.: 15/828,032

(22) Filed: Nov. 30, 2017

(65) Prior Publication Data

US 2018/0182289 A1 Jun. 28, 2018

(30) Foreign Application Priority Data

Dec. 28, 2016 (KR) .......................... 10-2016-0180716

(51) Int. Cl.
  *G09G 3/3233* (2016.01)
  *H01L 27/32* (2006.01)
  *G09G 3/3258* (2016.01)

(52) U.S. Cl.
  CPC ......... *G09G 3/3233* (2013.01); *G09G 3/3258* (2013.01); *H01L 27/3276* (2013.01); *G09G 2300/0465* (2013.01); *G09G 2300/0819* (2013.01); *G09G 2300/0842* (2013.01); *G09G 2300/0861* (2013.01);
  (Continued)

(58) Field of Classification Search
  CPC .. G09G 3/3233; G09G 3/3258; G09G 3/3266; G09G 3/3275; G09G 3/3291; G09G 2300/0819; G09G 2300/0866; G09G 2300/0439; G09G 2320/0233; G09G 2320/045; H01L 27/3276; H01L 27/3262; H01L 27/3248; H01L 27/3244
  See application file for complete search history.

(56) References Cited

U.S. PATENT DOCUMENTS 8,018,405 B2 * 9/2011 Kwak ................. G09G 3/3233
                                                          345/82
9,293,082 B2 * 3/2016 Jeon ...................... G09G 3/3233
(Continued)

FOREIGN PATENT DOCUMENTS

| CN | 104992674 A | 10/2015 |
| EP | 3176773 A2 | 6/2017 |
| KR | 2013-0030879 A | 3/2013 |

OTHER PUBLICATIONS

Partial European Search Report, European Patent Application No. 17207918.8, dated May 18, 2018, 21 pages.
(Continued)

*Primary Examiner* — Dismery Mercedes
(74) *Attorney, Agent, or Firm* — Fenwick & West LLP

(57) ABSTRACT

An organic light-emitting display device and a driving method thereof. A first pixel of the plurality of pixels is initialized in response to a first gate signal of the gate signals, receives a first data signal input thereto in response to a second gate signal generated after the first gate signal, and is controlled by the emission control signal to emit light in response to the first data signal. A second pixel of the plurality of pixels is initialized in response to the second gate signal, receives a second data signal input thereto in response to a third gate signal generated after the second gate signal, and is controlled by the emission control signal to emit light in response to the second data signal. The size of a non-display area is reduced.

9 Claims, 5 Drawing Sheets

(52) U.S. Cl.
CPC ............... *G09G 2310/0262* (2013.01); *G09G 2310/0264* (2013.01); *G09G 2310/067* (2013.01); *G09G 2320/045* (2013.01)

(56) References Cited

U.S. PATENT DOCUMENTS

| | | | |
|---|---|---|---|
| 9,491,829 B2* | 11/2016 | Kwak | H05B 33/0896 |
| 9,805,652 B2* | 10/2017 | Han | G09G 3/3233 |
| 9,842,537 B2* | 12/2017 | Lim | G09G 3/3225 |
| 10,223,969 B2* | 3/2019 | Park | G09G 3/3258 |
| 10,235,941 B2* | 3/2019 | Zhou | G09G 3/3233 |
| 10,262,586 B2* | 4/2019 | Lin | G09G 3/3233 |
| 10,297,197 B2* | 5/2019 | Chung | G09G 3/3233 |
| 10,424,243 B2* | 9/2019 | Kim | G09G 3/3233 |
| 2006/0103323 A1* | 5/2006 | Eom | G09G 3/3233 315/169.3 |
| 2011/0115764 A1 | 5/2011 | Chung | |
| 2011/0199357 A1 | 8/2011 | Chung et al. | |
| 2013/0314308 A1 | 11/2013 | Hsu et al. | |
| 2014/0333513 A1 | 11/2014 | Park et al. | |
| 2015/0138180 A1* | 5/2015 | Park | G09G 3/3233 345/212 |
| 2016/0125802 A1* | 5/2016 | Lee | G09G 3/3233 345/212 |
| 2016/0232853 A1 | 8/2016 | Hwang et al. | |
| 2016/0322446 A1 | 11/2016 | Park et al. | |
| 2016/0351124 A1* | 12/2016 | Kim | G09G 3/3241 |
| 2017/0025062 A1 | 1/2017 | Wang | |

OTHER PUBLICATIONS

Extended European Search Report, European Patent Application No. 17207918.8, dated Oct. 11, 2018, 34 pages.

* cited by examiner

ORGANIC LIGHT-EMITTING DISPLAY DEVICE AND DRIVING METHOD THEREOF

CROSS REFERENCE TO RELATED APPLICATION

This application claims priority from Korean Patent Application No. 10-2016-0180716, filed on Dec. 28, 2016, which is hereby incorporated by reference for all purposes as if fully set forth herein.

BACKGROUND

Field

The present disclosure relates to an organic light-emitting display device and a driving method thereof.

Description of Related Art

Active matrix type organic light-emitting display devices include organic light-emitting diodes (OLEDs) emitting light by themselves. OLEDs have superior characteristics, such as rapid response speeds, high emission efficiency, uniform luminance, and wide viewing angles. Respective OLEDs have an organic compound layer situated between an anode and a cathode. The organic compound layer includes a hole injection layer (HIL), a hole transport layer (HTL), an emission layer (EML), an electron transport layer (ETL), and an electron injection layer (EIL). When a driving voltage is applied to the anode and the cathode of OLEDs, holes passing through the hole transport layer and electrons passing through the electron transport layer migrate to the emission layer to recombine and form excitons. As a result, the emission layer generates visual light.

The luminance of organic light-emitting display devices may be non-uniform due to, for example, a deviation in threshold voltages of driving transistors applying driving currents to OLEDs and the threshold voltages of OLEDs.

Therefore, organic light-emitting display devices utilize an initialization voltage and an emission control signal, in addition to a data signal and a gate signal. In addition, organic light-emitting display devices require a time period in which gate voltages of driving transistors of pixels connected to gate lines corresponding thereto are initialized and the threshold voltages of the driving transistors and threshold voltages of the organic light-emitting diodes are sensed or compensated for. This may consequently complexify a driving block including OLEDs, as well as driving timing. When the driving block and driving timing of a display device become complexified, it may be difficult to use the display device in a high resolution application.

BRIEF SUMMARY

Various aspects of the present disclosure provide an organic light-emitting display device, able to reduce the size of a non-display area, and a driving method thereof.

Also provided are an organic light-emitting display device, capable of compensating for a threshold voltage and simplifying driving timing to be used in high resolution applications, and a driving method thereof.

According to an aspect of the present disclosure, an organic light-emitting display device may include: a display panel including a plurality of gate lines, a plurality of data lines intersecting the plurality of gate lines, a plurality of pixels emitting light by receiving gate signals and data signals through the plurality of gate lines and the plurality of data lines; a data driver delivering the data signals to the display panel; and a gate driver delivering the gate signals and an emission control signal. A first pixel of the plurality of pixels may be initialized in response to a first gate signal of the gate signals, may receive a first data signal input thereto in response to a second gate signal generated after the first gate signal, and may be controlled by the emission control signal to emit light in response to the first data signal. A second pixel of the plurality of pixels may be initialized in response to the second gate signal, may receive a second data signal input thereto in response to a third gate signal generated after the second gate signal, and may be controlled by the emission control signal to emit light in response to the second data signal.

According to another aspect of the present disclosure, a pixel circuit may include: a first transistor having a first electrode connected to a reference voltage line, a second electrode connected to a third node, and a gate electrode connected to a first gate line; a second transistor having a first electrode connected to a data line, a second electrode connected to a first node, and a gate electrode connected to a second gate line; a third transistor having a first electrode connected to a second node, a second electrode connected to the third node, and a gate electrode connected to the second gate line; a fourth transistor having a first electrode connected to the reference line, a second electrode connected to the first node, and a gate electrode connected to an emission control line; a fifth transistor having a first electrode connected to the second node, a second electrode connected to an anode of an organic light-emitting diode (OLED), and a gate electrode connected to the emission control line; a sixth transistor having a first electrode connected to the reference voltage line, a second electrode connected to the anode of the OLED, and a gate electrode connected to the second gate line; and a capacitor having a first electrode connected to the first node and a second electrode connected to the third node.

According to further another aspect of the present disclosure, a method of driving an organic light-emitting display device may include: sequentially initializing two pixels connected to a single date line; sequentially sampling threshold voltages of the two pixels and inputting a data signal to the two pixels; and simultaneously emitting light from two pixels.

According to still another aspect of the present disclosure, an organic light-emitting display device comprising a display panel comprising a plurality of gate lines, a plurality of emission control lines, a plurality of data lines intersecting the plurality of gate lines, and a plurality of pixels including at least a first pixel and a second pixel, a data driver delivering data signals to the pixels, and a gate driver delivering gate signals and emission control signals to the pixels. The gate driver is electrically connected to at least a first gate line, a second gate line, and a third gate line of the gate lines, and an emission control line. The first pixel is electrically connected to the first gate line and the second gate line, the first pixel being initialized responsive to a first gate signal via the first gate line, a first data voltage being input to the first pixel responsive to a second gate signal via the second gate line, and the first pixel emitting light according to the first data voltage responsive to an emission control signal via the emission control line. The second pixel is electrically connected to the second gate line and the third gate line, the second pixel being initialized responsive to a second gate signal via the second gate line, a second data voltage being input to the second pixel responsive to a third gate signal via the third gate line, and the second pixel emitting light according to the second data voltage responsive to the same emission control signal via the emission control line. Both the first pixel and the second pixel may emit light simultaneously in response to the same emission control signal.

In some embodiments, the first pixel is initialized during a first time period, the first data voltage is input to the first pixel and the second pixel is initialized during a second time period subsequent to the first time period, the second data voltage is input to the second pixel during a third time period subsequent to the second time period, and both the first pixel and the second pixel emit light according to the first data voltage and the second data voltage, respectively, during a fourth time period subsequent to the third time period. The first data voltage is held in the first pixel during the third time period.

In some embodiments, a first threshold voltage of a first driving transistor in the first pixel is sensed during the second time period, and a second threshold voltage of a second driving transistor in the second pixel is sensed during the third time period.

In some embodiments, the number of the gate lines connected to the gate driver is triple the number of the emission control lines connected to the gate driver. Each of the emission control lines may be electrically connected to two corresponding ones of the pixels of the display panel.

According to the present disclosure, the organic light-emitting display device and the driving method thereof can reduce the size of a non-display area.

In addition, according to the present disclosure, the organic light-emitting display device and the driving method thereof can compensate for a threshold voltage and simplify driving timing such that the organic light-emitting display device can be used in high resolution applications.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
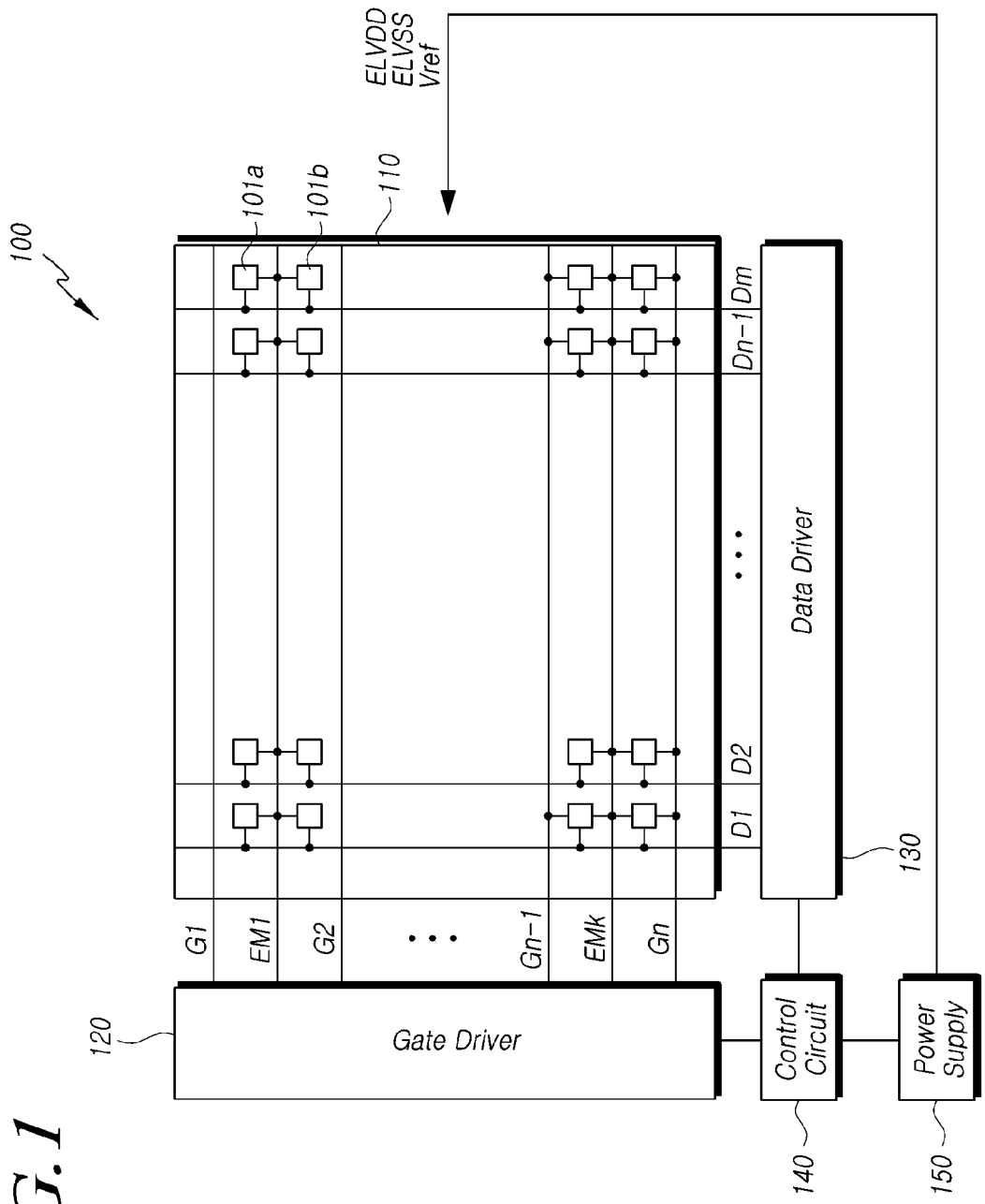
FIG. 1 is a configuration view illustrating an organic light-emitting display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a configuration view illustrating an organic light-emitting display device 100 according to exemplary embodiments.

Referring to FIG. 1, the organic light-emitting display device 100 includes a display panel 110, a gate driver 120, a data driver 130, a control circuit 140, and a power supply 150.

The display panel 110 includes a plurality of pixels (or subpixels) 101. Each of the plurality of pixels 101 includes an organic light-emitting diode (OLED, not shown) and a pixel circuit (not shown) allowing a driving current to flow into the OLED. The pixel circuit of each of the plurality of pixels 101 may generate a driving current using a data signal delivered thereto in response to a gate signal, as well as a voltage supplied from a first power source, and may deliver the driving current to the OLED in response to an emission control signal. In addition, each of the plurality of pixels 101 may be initialized by a reference voltage Vref delivered thereto and may compensate for the threshold voltage of the OLED, as well as the threshold voltage of a driving transistor included in each of the plurality of pixels 101.

The plurality of pixels 101 are arranged in pixel areas defined by a plurality of gate lines G1, G2, . . . , Gn−1, and Gn, intersecting a plurality of data lines D1, D2, . . . , Dm−1, and Dm. A plurality of emission control lines EM1, . . . , and EMk are connected to the plurality of pixels 101 in parallel to the plurality of gate lines G1, G2, . . . , Gn−1, and Gn. First and second gate lines adjacent to each other, among the plurality of gate lines G1, G2, . . . , Gn−1, and Gn, are connected to a first pixel 101a. Second and third gate lines adjacent to each other, among the plurality of gate lines G1, G2, . . . , Gn−1, and Gn, are connected to a second pixel 101b. The first and second pixels 101a and 101b are connected to the same data line and receive data signals in response to different gate signals. One emission control line among the plurality of emission control lines EM1, . . . , and EMk may deliver an emission control signal to the first pixel 101a and the second pixel 101b. Therefore, the number of the plurality of emission control lines EM1, . . . , and EMk, as required, may be half the number of the plurality of gate lines G1, G2, . . . , Gn−1, and Gn.

The gate driver 120 may generate gate signals and emission control signals to drive the plurality of gate lines G1, G2, . . . , Gn−1, and Gn and the plurality of emission control lines EM1, . . . , and EMk of the display panel 110. The gate driver 120 may output three gate signals and a single emission control signal to drive the first and second pixels 101a and 101b connected to the same data line. Since the gate driver 120 uses gate signals when delivering the reference voltage Vref and delivers the single emission control signal to two pixels, the number of signals output from the gate driver 120 can be reduced, as compared to the case in which the reference voltage Vref is delivered through a separate signal line or a single emission control signal is delivered to one pixel. Therefore, it is possible to reduce the number of output terminals of the gate driver 120. A reduction in the number of the output terminals of the gate driver 120 can reduce the size of the gate driver 120. Accordingly, it may not be necessary to increase the size of the gate driver 120, even in the case of driving the display panel 110 having a high resolution. In particular, the gate driver 120 may be implemented as gate-in-panel (GIP) circuits disposed in a peripheral area of the display panel 110, i.e. a non-display area (not shown). In this case, it is possible to reduce the size of the non-display area of the display panel 110.

The data driver 130 may generate data signals to drive the plurality of data lines D1, D2, . . . , Dm−1, and Dm. The data driver 130 may output a data voltage corresponding to a data signal in accordance with a horizontal synchronization time. The data driver 130 may have image signals delivered thereto and may output analog data signals to drive the plurality of data lines D1, D2, . . . , Dm−1, and Dm. The analog data signals may display a gray scale in response to data voltages.

The control circuit 140 may control the gate driver 120 and the data driver 130 to output gate signals and data signals, by delivering control signals to the gate driver 120 and the data driver 130, respectively. In addition, the control circuit 140 may adjust a voltage output from the power supply 150. However, the operation of the control circuit 140 is not limited thereto.

The power supply 150 can deliver a first voltage ELVDD and a second voltage EVLSS, as well as the reference voltage Vref, to the display panel 110. The first voltage ELVDD may be a positive voltage, while the second voltage EVLSS may be a ground voltage. In addition, the reference voltage Vref may be lower than the threshold voltage of the OLED. Voltages delivered by the power supply 150 are not limited thereto.

Figure 2:
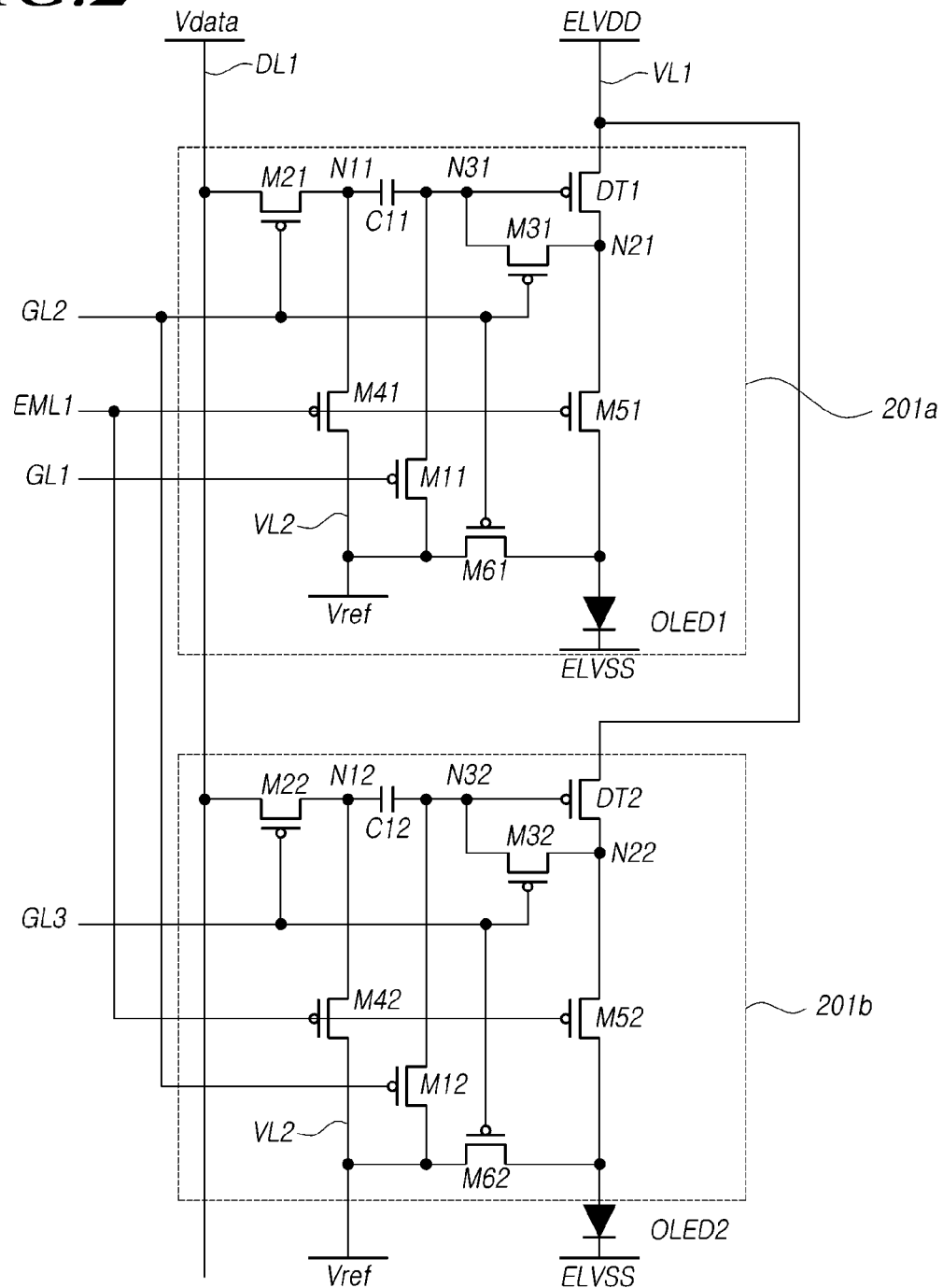
FIG. 2 is a circuit diagram illustrating an exemplary embodiment of the first pixel and an exemplary embodiment of the second pixel illustrated in FIG. 1.

FIG. 2 is a circuit diagram illustrating an exemplary embodiment of the first pixel and an exemplary embodiment of the second pixel illustrated in FIG. 1.

Referring to FIG. 2, a first pixel 201a and a second pixel 201b are connected to the same data line DL1. In addition, the first pixel 201a is connected to a first gate line GL1, a second gate line GL2, and an emission control line EML1. The second pixel 201b is connected to the second gate line GL2, a third gate line GL3, and the emission control line EML1. In addition, the first pixel 201a and the second pixel 201b may have a reference voltage Vref delivered thereto.

The first pixel 201a includes a pixel circuit and an organic light-emitting diode (OLED) OLED1. The pixel circuit include a driving transistor DT1, a first transistor M11, a second transistor M21, a third transistor M31, a fourth transistor M41, a fifth transistor M51, a sixth transistor M61, and a capacitor C11. The driving transistor DT1 and the first to sixth transistors M11 to M61 may be P-type metal-oxide-semiconductor (P-MOS) transistors. However, the present disclosure is not limited thereto.

The driving transistor DT1 has a first electrode connected to a power line VL1, through which a first voltage ELVDD is supplied, and a second electrode connected to a second node N21. In addition, the driving transistor DT1 has a gate electrode connected to a third node N31.

The first transistor M11 has a first electrode connected to a reference voltage line VL2, through which the reference voltage Vref is delivered, and a second electrode connected to the third node N31. In addition, the first transistor M11 has a gate electrode connected to the first gate line GL1.

The second transistor M21 has a first electrode connected to the data line DL1, through which a data voltage Vdata corresponding to a data signal is delivered, and a second electrode connected to the first node N11. In addition, the second transistor M12 has a gate electrode connected to the second gate line GL2.

The third transistor M31 may have a first electrode connected to the second node N21 and a second electrode connected to the third node N31. In addition, the third transistor M13 may have a gate electrode connected to the second gate line GL2.

The fourth transistor M41 has a first electrode connected to the reference voltage line VL2, through which the reference voltage Vref is delivered, and a second electrode connected to the first node N11. In addition, the fourth transistor M41 has a gate electrode connected to the emission control line EML1.

The fifth transistor M51 has a first electrode connected to the second node N21 and a second electrode connected to an anode of the OLED OLED1. In addition, the fifth transistor M51 has a gate electrode connected to the emission control line EML1.

The sixth transistor M61 has a first electrode connected to the reference voltage line VL2, through which the reference voltage Vref is delivered, and a second electrode connected to the anode of the OLED OLED1. In addition, the sixth transistor M16 may have a gate electrode connected to the second gate line GL2.

The capacitor C11 is connected between the first node N11 and the third node N31 to maintain a voltage of the third node N31, corresponding to the data voltage Vdata delivered to the first node N11. In addition, the voltage of the third node N31 of the capacitor C11 may be initialized in response to the reference voltage Vref.

The second pixel 201b includes a pixel circuit and an OLED OLED2. The pixel circuit includes a driving transistor DT2, a first transistor M12, a second transistor M22, a third transistor M32, a fourth transistor M42, a fifth transistor M52, a sixth transistor M62, and a capacitor C12. The driving transistor DT2 and the first to sixth transistors M12 to m62 may be P-type metal-oxide-semiconductor (P-MOS) transistors. However, the present disclosure is not limited thereto.

The driving transistor DT2 has a first electrode connected to the power line VL1, through which the first voltage ELVDD is supplied, and a second electrode connected to a second node N22. In addition, the driving transistor DT2 has a gate electrode connected to a third node N32.

The first transistor M12 has a first electrode connected to the reference voltage line VL2, through which the reference voltage Vref is delivered, and a second electrode connected to the third node N32. In addition, the first transistor M12 has a gate electrode connected to the second gate line GL2.

The second transistor M22 has a first electrode connected to the data line DL1, through which the data voltage Vdata corresponding to the data signal is delivered, and a second electrode connected to a first node N12. In addition, the second transistor M22 has a gate electrode connected to a third gate line GL3.

The third transistor M32 has a first electrode connected to the second node N22 and a second electrode connected to the third node N32. In addition, the third transistor M32 has a gate electrode connected to the third gate line GL3.

The fourth transistor M42 has a first electrode connected to the reference voltage line VL2, through which the reference voltage Vref is delivered, and a second electrode connected to the first node N12. In addition, the fourth transistor M42 has a gate electrode connected to the emission control line EML1.

The fifth transistor M52 has a first electrode connected to the second node N22 and a second electrode connected to an anode of the OLED OLED2. In addition, the fifth transistor M52 has a gate electrode connected to the emission control line EML1.

The sixth transistor M62 has a first electrode connected to the reference voltage line VL2, through which the first electrode delivers the reference voltage Vref, and a second electrode connected to the anode of the OLED OLED2. In addition, the sixth transistor M62 has a gate electrode connected to the third gate line GL3.

The capacitor C12 is connected between the first node N12 and the third node N32 to maintain a voltage of the third node N31, corresponding to the data voltage Vdata delivered to the first node N12. In addition, the voltage of the third node N32 of the capacitor C12 may be initialized in response to the reference voltage Vref.

Figure 3:
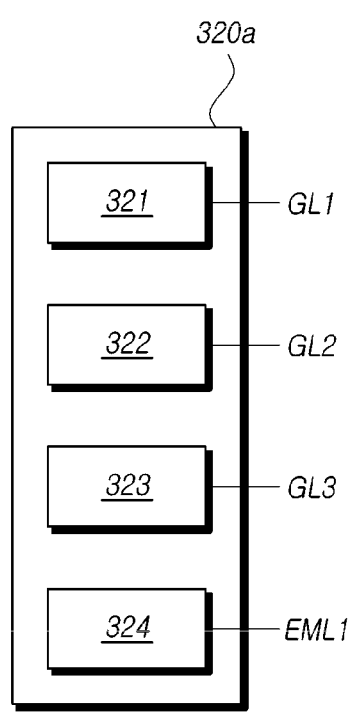
FIG. 3 is a configuration view illustrating an exemplary embodiment of the gate driver driving the first pixel and the second pixel illustrated in FIG. 2.

FIG. 3 is a configuration view illustrating an exemplary embodiment of the gate driver driving the pixels illustrated in FIG. 2.

Referring to FIG. 3, a gate driver 320a includes a first gate circuit 321 connected to a first gate line GL1 to output a first gate signal, a second gate circuit 322 connected to a second gate line GL2 to output a second gate signal, a third gate circuit 323 connected to a third gate line GL3 to output a third gate signal, and an emission control circuit 324 connected to an emission control line EML1 to output an emission control signal.

The gate driver 320a, as configured above, is connected to the first pixel 201a and the second pixel 201b, as described above with reference to FIG. 2. The first pixel 201a may have the first gate signal and the second gate signal delivered thereto through the first gate line GL1 and the second gate line GL2 connected thereto. The first pixel 201a may have a reference voltage delivered thereto in response to the first gate signal and may have a data signal delivered thereto in response to the second gate signal. In addition, the first pixel 201a may have an emission control signal delivered thereto through the emission control line EML1. The second pixel 201b may have the second gate signal and a third gate signal delivered thereto through the second gate line GL2 and the third gate line GL3 connected thereto. In addition, the second pixel 201b may have the emission control signal delivered thereto through the emission control line EML1. Thus, the first pixel 201a and the second pixel 201b may emit light in response to a single emission control signal.

As described above, the gate driver 320a may deliver three different gate signals and a single emission control signal to two pixels. Since gate signals are sequentially output, even in the case in which three different gate signals are delivered to two pixels, there may be no change in the number of gate circuits outputting gate signals to the gate driver 320a. In addition, since the first pixel 201a and the second pixel 201b receive an emission control signal through a single emission control line EML1, only a single emission control circuit 324 is required to output the emission control signal to the first and second pixels 201a and 201b. Thus, in the gate driver 320a, the number of emission control circuits 324 outputting emission control signals may be required to be lower than the number of the first to third gate circuits 321 to 323. Therefore, the gate driver 320a can be embodied while having a small size.

In addition, when the gate driver 320a is implemented as GIP circuits disposed in a non-display area (not shown) of a display panel, the number of the GIP circuits can be reduced, thereby reducing the size of the non-display area of the display panel.

Figure 4:
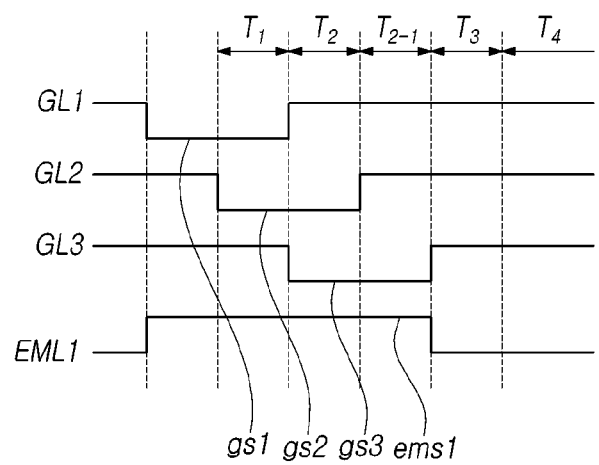
FIG. 4 is a timing diagram illustrating exemplary signals input to the first pixel and the second pixel illustrated in FIG. 2.

FIG. 4 is a timing diagram illustrating exemplary signals input to the first pixel 201a and the second pixel 201b illustrated in FIG. 2.

Referring to FIG. 4, a first gate signal gs1 and a second gate signal gs2 delivered through the first gate line GL1 and the second gate line GL2 may be signals delivered in a low state. An emission control signal ems1 delivered through the emission control line EML1 may be a signal delivered in a high state. However, the present disclosure is not limited thereto. In a case in which the first gate signal gs1 and the second gate signal gs2 are delivered in a high state, it may be considered that the first gate signal gs1 and the second gate signal gs2 are not delivered. In a case in which the emission control signal ems1 is delivered in a low state, it may be considered that the emission control signal ems1 is not delivered.

In a first time period T1, the first pixel 201a may have the first gate signal gs1 delivered thereto through the first gate line GL1 and the second gate signal gs2 delivered thereto through the second gate line GL2. In addition, the first pixel 201a may have the emission control signal ems1 delivered thereto through the emission control line EML1. When the first gate signal gs1 and the second gate signal gs2 are delivered to the first pixel 201a, the first transistor M11 is set to be in an on-state by the first gate signal gs1, while the second transistor M21, the third transistor M31, and the sixth transistor M61 are set to be in an on-state by the second gate signal gs2. In addition, the fourth transistor M41 and the fifth transistor M51 are turned to an off-state by the emission control signal ems1.

In the first pixel 201a, when the first transistor M11 is in an on-state, the reference voltage Vref may be delivered to the third node N31. Thus, the reference voltage Vref may be delivered to the second electrode of the capacitor C11. The capacitor C11 may be initialized by the reference voltage Vref. When the second transistor M21 is in an on-state, a data voltage Vdata may be delivered to the first node N11. When the third transistor M31 is in an on-state, the voltage of the second node N21 may be substantially the same as the voltage of the third node N31. Accordingly, the driving transistor DT1 electrically connects the nodes N21 and N31, thereby allowing a driving current to flow from the first electrode to the second electrode of the driving transistor DT1. In this case, since the fifth transistor M51 is in an off-state, the driving current may not flow into the OLED OLED1. In addition, since the sixth transistor M61 is in an on-state, the reference voltage Vref may be delivered to the anode of the OLED OLED1. The reference voltage Vref may be lower than the threshold voltage of the OLED OLED1. Therefore, the OLED OLED1 may not emit light.

In the first time period T1, the second pixel 201b may have the second gate signal gs2 delivered thereto through the second gate line GL2 and may not have a third gate signal gs3 delivered thereto through the third gate line GL3. In addition, the second pixel 201b may have the emission control signal ems1 delivered thereto through the emission control line EML1. When the second gate signal gs2 is delivered to the second pixel 201b, the first transistor M12 of the second pixel 201b may be in an on-state. When the third gate signal gs3 is not delivered to the second pixel 201b, the second transistor M22, the third transistor M32, and the sixth transistor M62 may be in an off-state. In addition, when the emission control signal ems1 is delivered to the second pixel 201b, the fifth transistor M42 and the fifth transistor M52 may be in an off-state.

In the second pixel 201b, when the first transistor M12 is in an on-state, the reference voltage Vref may be delivered to the third node N32. Therefore, the reference voltage Vref may be delivered to the second electrode of the capacitor C12. The capacitor C12 may be initialized by the reference voltage Vref.

In a second time period T2, the first gate signal gs1 may not be delivered to the first pixel 201a through the first gate line GL1. In addition, the first pixel 201a may have the second gate signal gs2 delivered thereto through the second gate line GL2. In addition, the first pixel 201a may have the emission control signal delivered thereto through the emission control line EML1. When the first pixel 201a does not have the first gate signal gs1 delivered thereto, the first transistor M11 may be in an off-state. When the first pixel 201a receives the second gate signal gs2, the second transistor M21, the third transistor M31, and the sixth transistor M61 may be in an on-state. In addition, when the first pixel 201b receives the emission control signal ems1, the fourth transistor M41 and the fifth transistor M51 may be in an off-state.

In the second time period T2, when the second transistor M21 of the first pixel 201a is in an on-state, a data voltage Vdata applied to the data line DL1 may be delivered to the first node N11. The data voltage Vdata delivered to the first node N11 in the second time period T2 may be different from the data voltage Vdata delivered to the first node N11 in the first time period T1. When the third transistor M31 of the first pixel 201a is in an on-state, the second node N21 and the third node N31 are connected to allow the driving transistor DT1 to act as a diode, so that a driving current flows from the first electrode to the second electrode of the driving transistor DT1. Here, since the driving current flows until a level of the voltage between the second electrode and the gate electrode of the driving transistor DT1 reaches the level of the threshold voltage of the driving transistor DT1, a voltage of the second electrode of the capacitor C11 connected to the third node n31 may correspond to the level of the threshold voltage of the driving transistor DT1. In addition, the sixth transistor M61 of the first pixel 201a may be in an on-state and the reference voltage Vref may be delivered to the anode of the OLED OLED1 through the reference line VL2 to which the reference voltage Vref is applied, and thus, a voltage of the anode of the OLED OLED1 may be initialized as the reference voltage Vref. Therefore, the second time period T2 may be a time period in which the threshold voltage of the driving transistor DT1 of the first pixel 201a is sensed and the voltage of the anode of the OLED OLED1 is initialized.

In addition, in the second time period T2, the second pixel 201b may receive the second gate signal gs2 through the second gate line GL2 and the third gate signal gs3 through the third gate line GL3. In addition, the second pixel 201b may receive the emission control signal ems1 through the emission control line EML1. In the second pixel 201b, the first transistor M12 is switched to an on-state by the second gate signal gs2, and the second transistor M22, the third transistor M32, and the sixth transistor M62 are set to be in an on-state by the second gate signal gs2. In addition, the fourth transistor M41 and the fifth transistor M51 may be set to be in an off-state by the emission control signal ems1.

In the second pixel 201b, when the first transistor M12 is in an on-state, the reference voltage Vref may be delivered to the third node N32. Thus, the reference voltage Vref may be delivered to the second electrode of the capacitor C12. When the second transistor M22 is in an on-state, a data voltage Vdata may be delivered to the first node N12. The data voltage Vdata delivered to the first node N12 of the second pixel 201b may be substantially the same as the data voltage Vdata delivered to the first node N11 in the second time period T2. When the third transistor M32 is in an on-state, the second node N22 and the third node N32 are connected to allow the driving transistor DT2 of the second pixel 201b to act as a diode, so that a driving current flows from the first electrode to the second electrode of the driving transistor DT2. In this case, since the fifth transistor M52 is in an off-state, the driving current may not flow into the OLED OLED2. In addition, since the sixth transistor M62 is in an on-state, the reference voltage Vref may be delivered to the anode of the OLED OLED2. The reference voltage Vref may be lower than the threshold voltage of the OLED OLED2, and thus, the OLED OLED2 may not emit light.

In a (2-1)th time period T2-1, the first pixel 201a may not receive the first gate signal gs1 through the first gate line GL1 and the second gate signal gs2 through the second gate line GL2. In addition, the first pixel 201a may receive the emission control signal. Therefore, the first to sixth transistors M11 to M61 of the first pixel 201a may maintain an off-state.

In the (2-1)th time period T2-1, when the first to sixth transistors M11 to M61 of the first pixel 201a are in an off-state, the capacitor C11 is in a floating state, so that the data voltage Vdata input to the first electrode of the capacitor C11 in the second time period T2 can be maintained in the (2-1)th time period T2-1. Therefore, the (2-1)th time period T2-1 may be a time period in which the data voltage Vdata is held in the first pixel 201a.

In the (2-1)th time period T2-1, the second pixel 201b may not receive the first gate signal gs1 through the first gate line GL1 and may receive the second gate signal gs2 through the second gate line GL2. In addition, the second pixel 201b may receive the emission control signal through the emission control line EML1. When the second gate signal gs2 is not delivered to the second pixel 201b, the first transistor M12 may be in an off-state. When the second gate signal gs2 is delivered to the second pixel 201b, the second transistor M22, the third transistor M32, and the sixth transistor M62 may be in an on-state. In addition, the fourth transistor M42 and the fifth transistor M52 may be set to be in an off-state by the emission control signal ems1.

In the (2-1)th time period T2-1, when the second transistor M22 of the second pixel 201b is in an on-state, a data voltage Vdata is delivered to the first node N12, so that the data voltage Vdata can be delivered to the first electrode of the capacitor C12. The data voltage Vdata delivered to the first node N12 in the (2-1)th time period T2-1 may be the data voltage Vdata applied to the data line DL1 in the (2-1)th time period T2-1. When the third transistor M32 is in an on-state, the second node N22 and the third node N32 are connected, so that a driving current flows from the first electrode to the second electrode of the driving transistor DT2. Since the driving current flows until a voltage between the second electrode and the gate electrode of the driving transistor DT2 reaches a threshold voltage of the driving transistor DT2, a voltage of the second electrode of the capacitor C12 connected to the third node N32 may correspond to the threshold voltage of the driving transistor DT2. In addition, the sixth transistor M62 of the second pixel 201b may be in an on-state and the reference voltage Vref may be delivered to the anode of the OLED OLED2 through the reference line VL2 to which the reference voltage Vref is applied, and thus, a voltage of the anode of the OLED OLED2 may be initialized as the reference voltage Vref. Therefore, the (2-1)th time period T2-1 may be a time period in which a threshold voltage of the driving transistor DT2 of the second pixel 201b is sensed and the voltage of the anode of the OLED OLED2 is initialized.

In a third time period T3, the first pixel 201a and the second pixel 201b may not receive the first and second gate signals gs1 and gs2 and the second and third gate signals gs2 and gs3, respectively. In addition, each of the first pixel 201a and the second pixel 201b may not receive the emission control signal through the emission control line EML1.

When the first pixel 201a does not receive the emission control signal ems1, the fourth transistor M41 and the fifth transistor M51 may be in an on-state. When the fourth transistor M41 of the first transistor 201a is in an on-state, a reference voltage Vref may be delivered to the first node N11. When the reference voltage Vref is delivered to the first node N11, a voltage of the first node N11 may be changed from the data voltage Vdata to the reference voltage Vref, and a voltage of the third node N31 may be set to correspond to a difference between the data voltage Vdata and the reference voltage Vref and correspond to the threshold voltage of the driving transistor DT1, in response to a voltage stored the capacitor C11. Therefore, the driving current flowing from the first electrode to the second electrode of the driving transistor DT1 may be represented by Formula 1:

$$I_{OLED} = \frac{\beta}{2}(V_{GS} - V_{th})^2 \qquad (1)$$
$$= \frac{\beta}{2}(ELVDD - (ELVDD - V_{th}) - (V_{ref} - V_{data}) - V_{th})^2$$
$$= \frac{\beta}{2}(V_{data} - V_{ref})^2$$

where $I_{OLED}$ is a magnitude of a driving current, ß is a constant, ELVDD is a voltage of the first power, $V_{th}$ is the threshold voltage of the driving transistor DT1, $V_{data}$ is a voltage of a data signal, and $V_{ref}$ is a reference voltage.

Since a driving current flows regardless of the magnitude of a threshold voltage, the driving current flowing from the first pixel 201a to the OLED OLED1 in the third time period T3 may be a driving current in which the threshold voltage of the driving transistor DT1 is compensated for.

For the reason described above, the driving current flowing from the second pixel 201b to the OLED OLED2 may be a driving current in which the threshold voltage of the driving transistor DT2 is compensated for.

Therefore, points in time at which the first pixel 201a and the second pixel 201b emit light can be controlled by a single emission control signal, so that two adjacent pixels connected to the same data line, as in the gate driver 320a illustrated in FIG. 3, can receive an emission control signal from a single emission control circuit. Accordingly, the number of the emission control circuits can be reduced to reduce the number and the size of output terminals of the gate driver 320a. In particular, when a holding period in which a data voltage is maintained in the first pixel 201a is set, points in time at which the first pixel 201a and the second pixel 201b emit light can be controlled by a single emission control signal.

Figure 5:
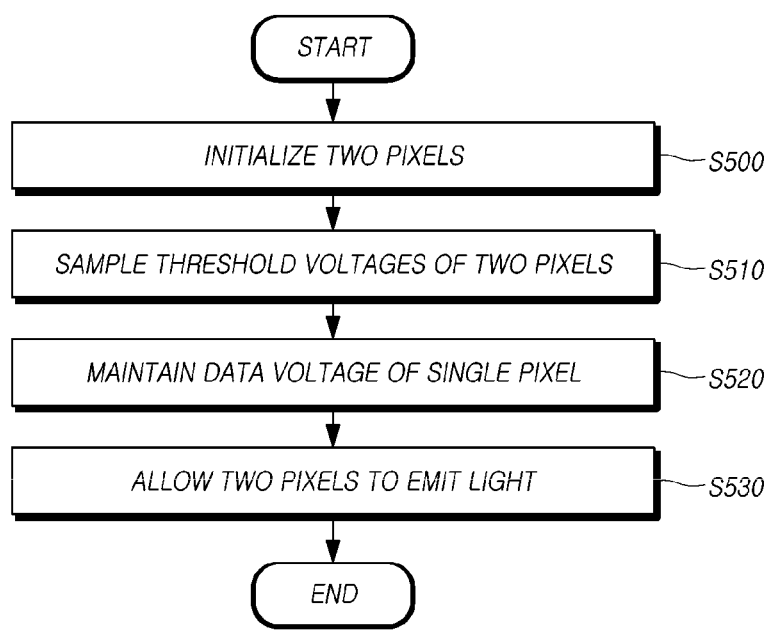
FIG. 5 is a flowchart illustrating a method of driving the organic light-emitting display device illustrated in FIG. 1, according to exemplary embodiments.

FIG. 5 is a flowchart illustrating a method of driving the organic light-emitting display device illustrated in FIG. 1, according to exemplary embodiments.

Referring to FIG. 5, the method of driving the organic light-emitting display device includes step S500 of initializing two pixels. The two pixels may be pixels that are adjacent to each other while being connected to the same data line. In addition, the two pixels may be pixels to which data signals are input in response to different gate signals. The two pixels may be referred to as a first pixel and a second pixel, respectively. The first pixel and the second pixel may be sequentially initialized. The first pixel may be initialized in response to a first gate signal, while the second pixel may be initialized in response to a second gate signal generated after the first gate signal. The initialization may be performed by delivering reference voltages to the first pixel and the second pixel. The reference voltages may be the first gate signal and the second gate signal delivered to the first pixel and the second pixel, instead of being separate control signals.

The method of driving the organic light-emitting display device includes step S510 of sampling the threshold voltages of the two pixels. In addition, data voltages may be input to the two pixels. The sampling of the threshold voltages of the two pixels may be performed such that the sampling time of the first pixel is a different time from the sampling time of the second pixel. In addition, the threshold voltages of the first pixel and the second pixel may be sequentially sampled using the second gate signal and a third gate signal generated after the second gate signal. The threshold voltages to be sampled may be threshold voltages of driving transistors allowing driving currents to flow into the first pixel and the second pixel, respectively. In addition, while the threshold voltages are being sampled, data signals may be input to the first pixel and the second pixel. The first pixel may receive the data signal input thereto in response to the second gate signal, while the second pixel may receive the data signal input thereto in response to the third gate signal. Since the second gate signal and the third gate signal inputting the data signals during the sampling of the threshold voltages can be used, the threshold voltages of the first pixel and the second pixel can be sampled without using separate signals.

In addition, in step S530, the first pixel of the two pixels maintains the data signal input thereto. A period of time for which the first pixel maintains the input data signal may be a period of time for which the data signal is being input to the second pixel. An emission control signal can be input at the same time, since the first pixel has a period of time for which the received data signal is maintained.

In step S530, the two pixels emit light. As the first pixel and the second pixel include OLEDs emitting light in response to driving voltages, respectively, the OLEDs can simultaneously emit light. The term "simultaneously" used herein may mean "at the same time" as well as "at slightly different times". In addition, the OLEDs may be allowed to emit light in response to a single emission control signal, so that the first pixel and the second pixel can simultaneously emit light. Since the first pixel and the second pixel can emit light in response to a single emission control signal, the number of emission control circuits outputting emission control signals can be reduced. This can consequently reduce the number of circuits outputting signals in the gate driver, thereby allowing the gate driver to be embodied in a small size.

In addition, since the first pixel and the second pixel are initialized and sampled using the first to third gate signals, it is unnecessary for the gate driver to output separate signals for the initialization and the sampling. This can consequently reduce the number of circuits outputting signals in the gate driver, thereby allowing the gate driver to be embodied in a small size.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. An organic light-emitting display device comprising:
    a display panel comprising a plurality of gate lines, a plurality of data lines intersecting the plurality of gate lines, and a plurality of pixels, each gate line of the plurality of gate lines and each data line for the plurality of data lines coupled to at least one pixel of the plurality of pixels, each pixel having a driving transistor for providing a driving current to an organic light-emitting diode, a first transistor coupled to a gate electrode of the driving transistor, and a second transistor coupled to a data line of the plurality of data lines;
    a data driver delivering data signals to the pixels of the display panel through the plurality of data lines; and
    a gate driver delivering gate signals through the plurality of gate lines and emission control signals through a plurality of emission control lines to the pixels of the display panel,
    wherein a first pixel of the plurality of pixels is initialized in response to a first gate signal having a first signal level during a first time period being provided to the first transistor of the first pixel and a second gate signal having the first signal level during the first time period being provided to the second transistor of the first pixel, receives a first data signal input thereto in response to the second gate signal having the first signal level being provided to the second transistor of the first pixel and the first gate signal having a second signal level being provided to the first transistor of the first pixel during a first part of a second time period subsequent to the first time period, and is controlled by one of the emission control signals to emit light according to the first data signal, and
    a second pixel of the plurality of pixels is initialized in response to the second gate signal having the first signal level during a first part of the second time period being provided to the first transistor of the second pixel and a third gate signal having the first signal level during the first part of the second time period being provided to the second transistor of the second pixel, receives a second data signal input thereto in response to the third gate signal having the first signal level being provided to the second transistor of the second pixel and the second gate signal having the second signal level being provided to the first transistor of the second pixel during a second part of the second time period, and is controlled by the same emission control signal to emit light according to the second data signal.

2. The organic light-emitting display device according to claim 1, wherein, after the first gate signal is received, the first pixel maintains the first gate signal without emitting light while the second data signal is being input to the second pixel.

3. The organic light-emitting display device according to claim 1, wherein the gate driver comprises a first gate circuit connected to a first gate line of the plurality of gate lines, a second gate circuit connected to a second gate line thereof, a third gate circuit connected to a third gate line thereof, and an emission control circuit connected to said one of the emission control lines.

4. The organic light-emitting display device according to claim 1, wherein the first transistor delivers a reference voltage to the gate electrode of the driving transistor in response to the first gate signal having the first signal level, wherein the second transistor delivers the data signals to a first node in response to the second gate signal having the first signal level, and wherein at least one of the first pixel and the second pixel further comprises:
    a third transistor connecting a second node and the gate electrode of the driving transistor in response to the second gate signal having the first signal level;
    a fourth transistor delivering the reference signal to the first node in response to the emission control signal;
    a fifth transistor delivering a driving current flowing through the second node to an organic light-emitting diode in response to the emission control signal;
    a sixth transistor delivering the reference voltage to the organic light-emitting diode in response to the second gate signal having the first signal level; and
    a capacitor connected between the first node and the gate electrode of the first driving transistor.

5. An organic light-emitting display device comprising:
    a display panel comprising a plurality of gate lines, a plurality of emission control lines, a plurality of data lines intersecting the plurality of gate lines, and a plurality of pixels including at least a first pixel and a second pixel;
    a data driver delivering data signals to the pixels; and
    a gate driver delivering gate signals and emission control signals to the pixels, the gate driver electrically connected to at least a first gate line, a second gate line, and a third gate line of the gate lines, and an emission control line,
    wherein the first pixel is electrically connected to the first gate line and the second gate line, the first pixel being initialized during a first time period responsive to a first gate signal via the first gate line, a first data voltage being input to the first pixel during a second time period subsequent to the first time period responsive to a second gate signal via the second gate line, a first threshold voltage of a first driving transistor in the first pixel being sensed during the second time period, and the first pixel emitting light according to the first data voltage during a fourth time period subsequent to a third time period responsive to an emission control signal via the emission control line, and
    wherein the second pixel is electrically connected to the second gate line and the third gate line, the second pixel being initialized during the second time period responsive to a second gate signal via the second gate line, a second data voltage being input to the second pixel during the third time period subsequent to the second time period responsive to a third gate signal via the third gate line, a second threshold voltage of a second driving transistor in the second pixel being sensed during the third time period, and the second pixel emitting light according to the second data voltage during the fourth time period responsive to the same emission control signal via the emission control line.

6. The organic light-emitting display device of claim 5, wherein the first data voltage is held in the first pixel during the third time period.

7. The organic light-emitting display device of claim 5, wherein both the first pixel and the second pixel emit light simultaneously in response to the same emission control signal.

8. The organic light-emitting display device of claim 5, a number of the gate lines connected to the gate driver is triple a number of the emission control lines connected to the gate driver.

9. The organic light-emitting display device of claim 8, wherein each of the emission control lines is electrically connected to two corresponding ones of the pixels of the display panel.

* * * * *